United States Patent
Ishikawa et al.

(10) Patent No.: US 11,353,757 B2
(45) Date of Patent: Jun. 7, 2022

(54) DISPLAY DEVICE

(71) Applicant: Japan Display Inc., Tokyo (JP)

(72) Inventors: Tomokazu Ishikawa, Tokyo (JP); Masaru Nakakomi, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 136 days.

(21) Appl. No.: 16/812,840

(22) Filed: Mar. 9, 2020

(65) Prior Publication Data

US 2020/0292890 A1 Sep. 17, 2020

(30) Foreign Application Priority Data

Mar. 11, 2019 (JP) .............................. JP2019-043818

(51) Int. Cl.
| | | |
|---|---|---|
| *G02F 1/1362* | (2006.01) | |
| *G02F 1/1333* | (2006.01) | |
| *H01L 23/60* | (2006.01) | |
| *H01L 27/12* | (2006.01) | |

(52) U.S. Cl.
CPC .. *G02F 1/136204* (2013.01); *G02F 1/133345* (2013.01); *G02F 1/136286* (2013.01); *H01L 23/60* (2013.01); *H01L 27/1244* (2013.01); *H01L 27/1248* (2013.01)

(58) Field of Classification Search
CPC ............ G02F 1/13629; G02F 1/13454; G02F 1/133388; G02F 1/133345; G02F 1/1333; G02F 1/1339; G02F 1/136286; G02F 1/136204; G09G 3/3266; G09G 2310/00; G09G 2300/00; G09G 2300/0408; G09F 9/30; H01L 27/1248; H01L 27/1244; H01L 23/60
See application file for complete search history.

(56) References Cited

U.S. PATENT DOCUMENTS

| | | | | |
|---|---|---|---|---|
| 2011/0234964 A1* | 9/2011 | Moriwaki | ......... | G02F 1/136204 349/149 |
| 2016/0109747 A1* | 4/2016 | Nodera | ................. | G02F 1/1339 349/43 |
| 2017/0235182 A1* | 8/2017 | Abe | ................. | G02F 1/136286 257/72 |

FOREIGN PATENT DOCUMENTS

JP 2017-146450 A 8/2017

* cited by examiner

*Primary Examiner* — Mariam Qureshi
(74) *Attorney, Agent, or Firm* — Xsensus LLP

(57) ABSTRACT

According to one embodiment, a display device includes, a first inorganic insulating layer, a first metal layer, a wiring group, a first organic insulating layer formed above the first inorganic insulating layer, the first metal layer and the wiring group, a second inorganic insulating layer formed above the first organic insulating layer and includes an opening portion overlapping the first metal layer, and a first transparent conductive layer formed above the second inorganic insulating layer, overlapping the opening portion and electrically connected to the first metal layer. The first organic insulating layer includes a groove portion which exposes the first inorganic insulating layer between the opening portion and the wiring group.

15 Claims, 8 Drawing Sheets

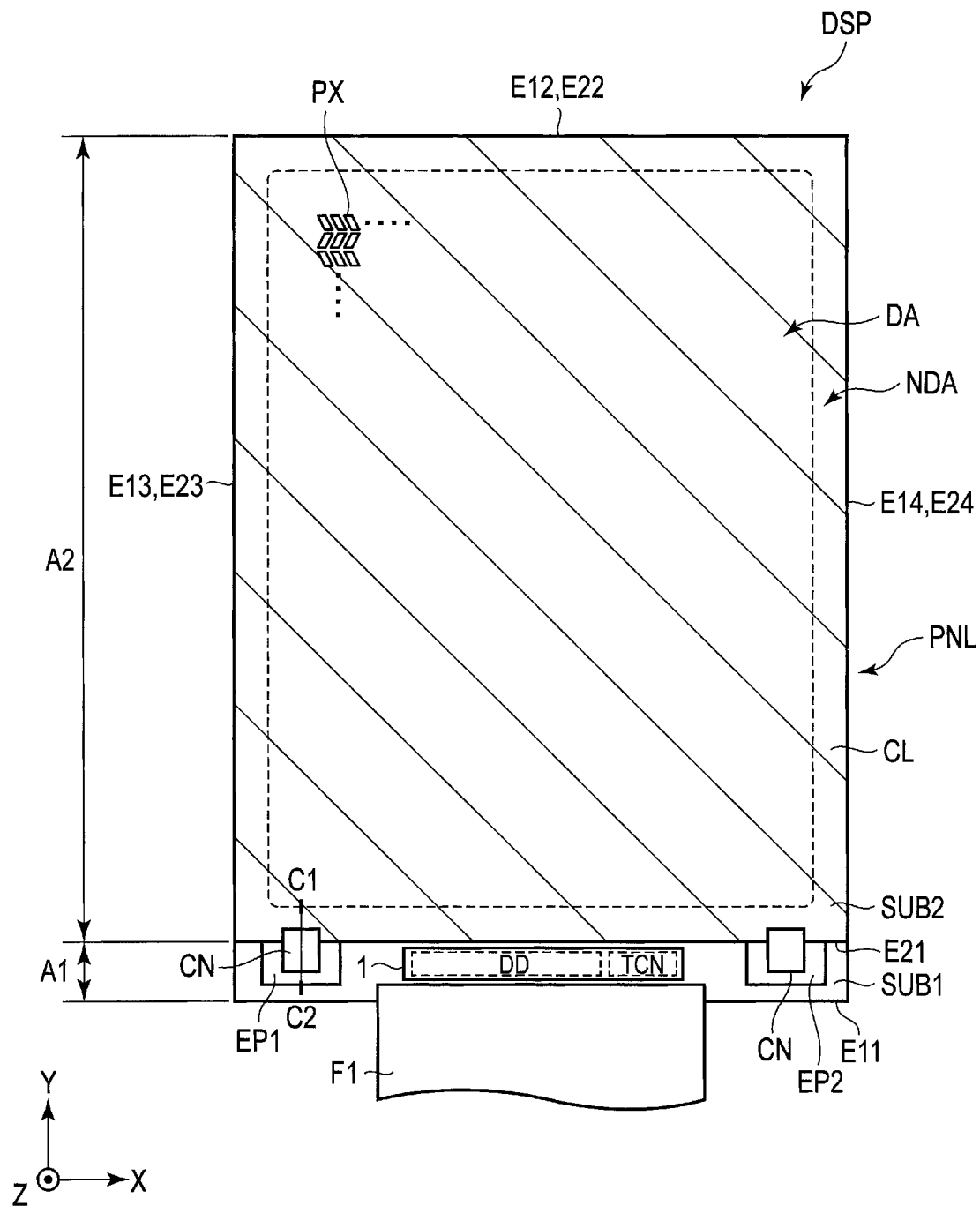
F I G. 1

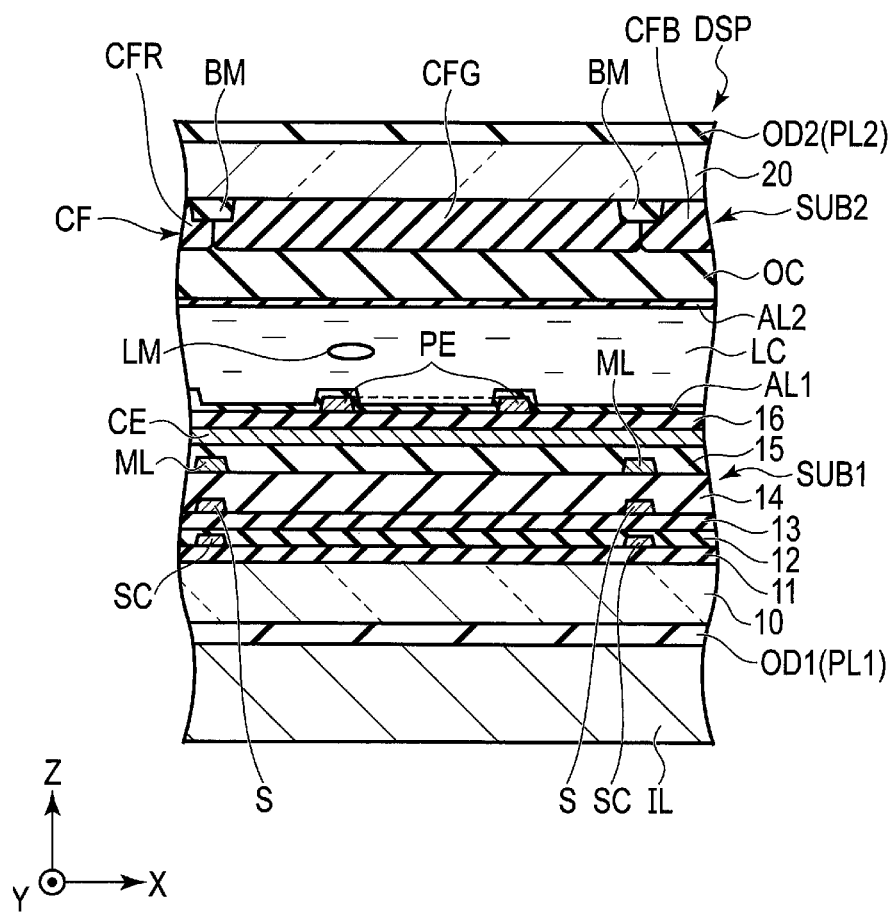
F I G. 4

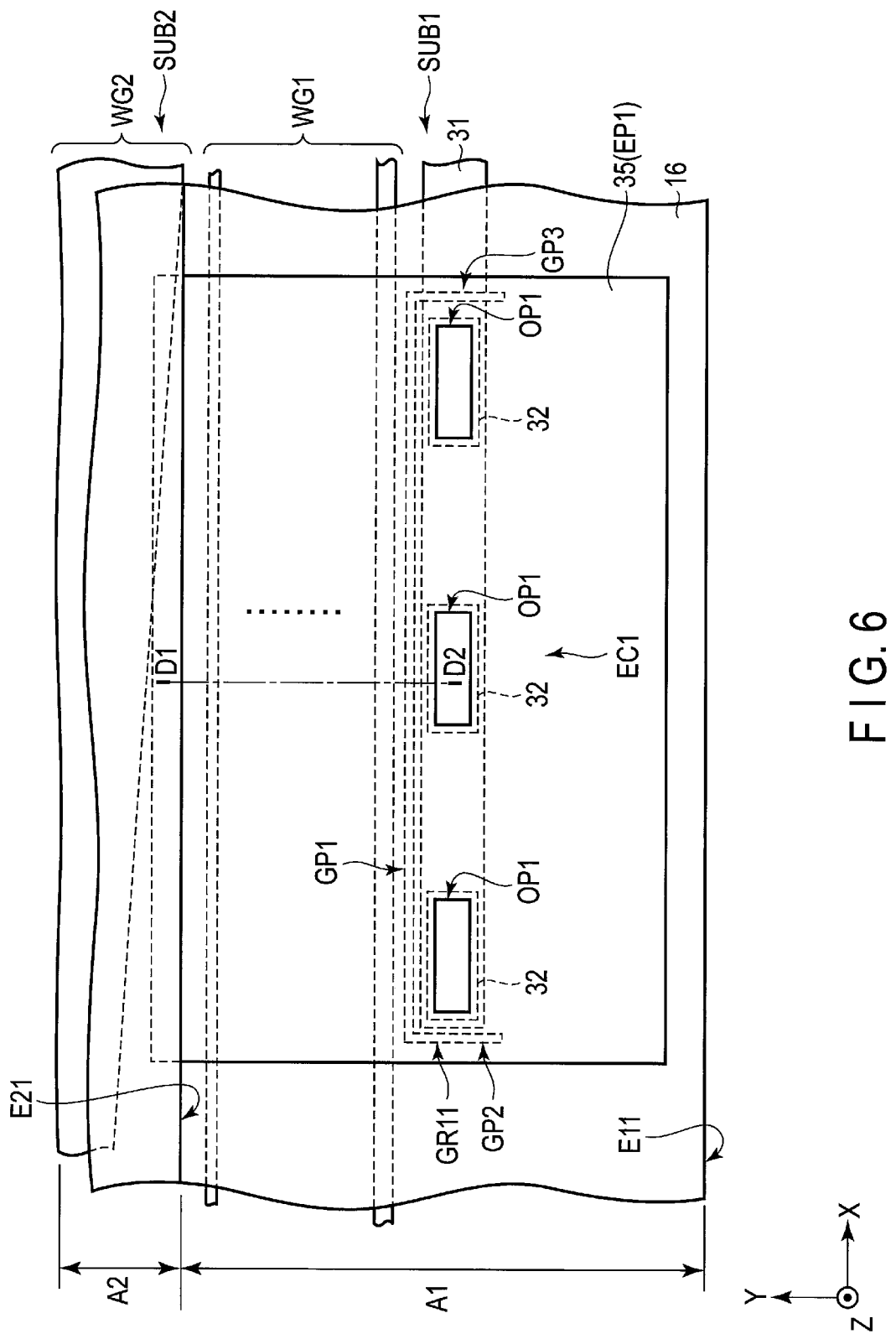
F I G. 6

DISPLAY DEVICE

CROSS-REFERENCE TO RELATED APPLICATIONS

This application is based upon and claims the benefit of priority from Japanese Patent Application No. 2019-043818, filed Mar. 11, 2019, the entire contents of which are incorporated herein by reference.

FIELD

Embodiments described herein relate generally to a display device.

BACKGROUND

In recent years, various types liquid crystal display devices in which liquid crystal molecules are rotate by an electric field parallel to the substrate are studied. For example, a liquid crystal display device in which an antistatic transparent conducting film formed on a surface of a counter substrate and a transparent conducting film formed on an organic layer located in an terminal portion of an array substrate are connected with an electric conducting tape, and wiring is formed under the organic layer located in the terminal portion is proposed.

BRIEF DESCRIPTION OF THE DRAWINGS

FIG. 1 is a plan view showing a display device of one embodiment.

FIG. 4 is a cross-sectional view showing a configuration example of the display panel shown in FIG. 1.

FIG. 6 is an enlarged view showing the groove portions shown in FIG. 5 and their surroundings.

DETAILED DESCRIPTION

Figure 2:
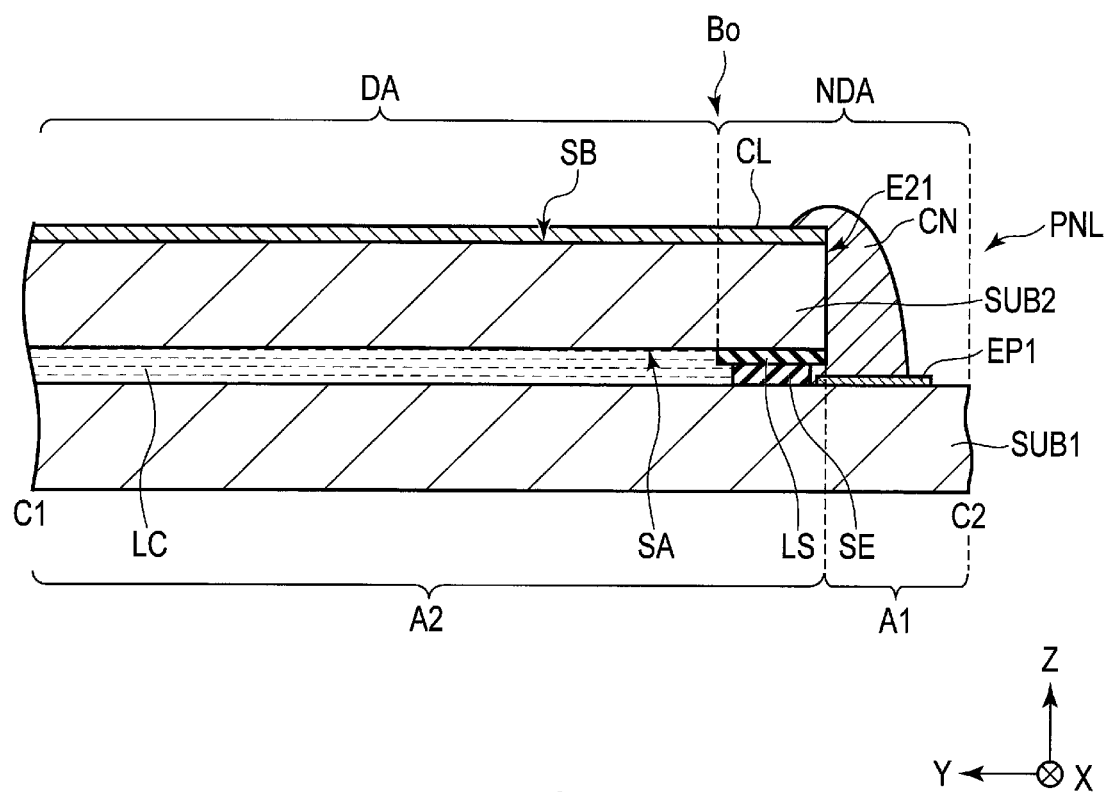
FIG. 2 is a cross sectional view of a display panel taken along line C1-C2 shown in FIG. 1.

In general, according to one embodiment, a display device comprises a first substrate comprising a first region and a second region; a second substrate comprising a substrate end portion located in a boundary between the first region and the second region, and overlaps the second region; and a conductive connection member, the first substrate comprising, in the first region, a first inorganic insulating layer, a first metal layer, a wiring group located between the substrate end portion and the first metal layer and formed above the first inorganic insulating layer, a first organic insulating layer formed above the first inorganic insulating layer, the first metal layer and the wiring group, a second inorganic insulating layer formed above the first organic insulating layer and comprising an opening portion overlapping the first metal layer, and a first transparent conductive layer formed above the second inorganic insulating layer, overlapping the opening portion and electrically connected to the first metal layer, the second substrate comprising an inner surface opposing the first substrate, an outer surface opposite to the inner surface, and a second transparent conductive layer formed on the outer surface, the connection member being in contact with the substrate end portion and connecting the first transparent conductive layer and the second transparent conductive layer to each other, the wiring group overlapping the first transparent conductive layer, and the first organic insulating layer comprising a groove portion which exposes the first inorganic insulating layer between the opening portion and the wiring group.

According to another embodiment, a display device comprises a first substrate comprising a first region and a second region; a second substrate comprising a substrate end portion located in a boundary between the first region and the second region and overlapping the second region, and a conductive connection member, the first substrate comprising, in the first region, a first inorganic insulating layer, a first metal layer, a wiring group located between the substrate end portion and the first metal layer and formed above the first inorganic insulating layer, a first organic insulating layer formed above the first inorganic insulating layer, the first metal layer and the wiring group, a second inorganic insulating layer formed above the first organic insulating layer and comprising an opening portion overlapping the first metal layer, and a first transparent conductive layer formed above the second inorganic insulating layer, overlapping the opening portion and electrically connected to the first metal layer, the second substrate comprising an inner surface opposing the first substrate, an outer surface opposite to the inner surface and a second transparent conductive layer formed in the outer surface, the connection member being in contact with the substrate end portion and connecting the first transparent conductive layer and the second transparent conductive layer to each other, the first organic insulating layer comprising a groove portion which exposes the first inorganic insulating layer between the opening portion and the wiring group, and the first transparent conductive layer being in contact with the first inorganic insulating layer in the groove portion.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. To more clarify the explanations, the drawings may pictorially show width, thickness, shape and the like, of each portion as compared with an actual aspect, but they are mere examples and do not restrict the interpretation of the invention. In addition, in the specification and drawings, the same elements as those described in connection with preceding drawings are denoted by like reference numbers, and detailed description thereof is omitted unless necessary.

FIG. 1 is a plan view showing a display device DSP according to one embodiment. For example, the first direction X, the second direction Y and the third direction Z are orthogonal to one another but may intersect at an angle other than ninety degrees. The first direction X and the second direction Y correspond to the directions parallel to the surface of a substrate which constitutes the display device DSP, and the third direction Z corresponds to the thickness direction of the display device DSP. In the present specification, a position of a distal side of arrow indicating the third direction Z is called an upper position while a position of a side opposite to the distal end of the arrow is called a lower position. Further, it is assumed that an observation position at which the display device DSP is to be observed is at the pointing end side of the arrow indicating the third direction Z, and a view toward an X-Y plane defined by the first direction X and the second direction Y from this observation position is called a planar view.

The display device DSP may be a display device which requires a display panels PNL and an independent light source, such as a liquid crystal display device, or a self-luminous display device such as an organic EL display device or a micro-light emitting diode (LED), or an electrophoretic display device. The embodiments provided hereinafter will be described in connection with example cases of liquid crystal display devices.

As shown in FIG. 1, the display device DSP comprises a display panel PNL, an IC chip 1 and a wiring substrate F1.

The display panel PNL comprises a first substrate SUB1, a second substrate SUB2 and a liquid crystal layer LC, which will be described later. The display panel PNL includes a display area DA which displays images and a frame-shaped non-display area NDA surrounding the display area DA.

The first substrate SUB1 comprises end portions E11 and E12 extending in the first direction X and end portions E13 and E14 extending in the second direction Y. The second substrate SUB2 comprises end portions E21 and E22 extending in the first direction X and end portions E23 and E24 extending in the second direction Y. The first substrate SUB1 comprises a first region A1 and a second region A2 arranged in the second direction Y. In plan view, the second substrate SUB2 overlaps the second region A2, but does not overlap the first region A1. The end portion E21 corresponds to an end of the substrate along the boundary between the first region A1 and the second region A2. That is, the first region A1 corresponds, in plan view, to the region surrounded by the end portions E11, E21, E13 and E14. The second region A2 corresponds to the region surrounded by the end portions E21, E12, E13 and E14. Moreover, the second region A2 may as well be referred to as a two-sheet portion of the display panel PNL, in which the first substrate SUB1 and the second substrate SUB2 overlap each other, and the first region A1 may be referred to as a one-sheet portion of the display panel PNL, in which the first substrate SUB1 is exposed from the second substrate SUB2.

The display area DA is included in the second region A2. The display area DA comprises a plurality of pixels PX arranged in a matrix in the first direction (row direction) X and the second direction (column direction) Y. The term pixel PX, here, is meant a minimum unit which can be individually controlled according to the pixel signal, and it may be referred to as a subpixel. Each pixel PX is one of, for example, a red pixel which displays red, a green pixel which displays green, a blue pixel which displays blue or a white pixel which displays white.

An outside of the display area DA in the second region A2 and the first region A1 are equivalent to the non-display area NDA. The IC chip 1 and the wiring substrate F1 may read signals from the display panel PNL, but they mainly function as signal sources which supply signals to the display panel PNL. These signal sources are mounted on the first region A1. In the example illustrated, the wiring substrate F1 and the IC chip 1 are each mounted on the first region A1. Here, note that the IC chip 1 may be mounted on the wiring substrate F1. The IC chip 1 includes a built-in display driver DD which outputs signals necessary for image display in an image display mode which displays images. Moreover, in the example illustrated, the IC chip 1 contains a built-in touch controller TCN which controls a touch sensing mode which detects approach or contact of an object to the display device DSP. In the drawing, the display driver DD and the touch controller TCN are indicated by dotted lines. The wiring substrate F1 is a flexible printed circuit board which can be bent.

The first substrate SUB1 comprises a plurality of ground pads EP (EP1 and EP2) in the first region A1. Each of the ground pads EP is formed by stacking a transparent conductive layer 35, a metal layer 33 and the like, which will be described later, one on another. In the example illustrated, the ground pad EP1 is located between the IC chip 1 and the end portion E13, and the ground pad EP2 is located between the IC chip 1 and the end portion E14.

The second substrate SUB2 comprises a transparent conductive layer CL. The transparent conductive layer CL is formed substantially an entire region which overlaps the second region A2, and also overlaps each of the pixels PX in the display area DA. The transparent conductive layer CL is formed from a transparent conductive material such as indium tin oxide (ITO) or indium zinc oxide (IZO).

A connection member CN is provided in the non-display area NDA so as to electrically connect each of the ground pads EP to the transparent conductive layer CL. The connection member CN is conductive and it is, for example, a conductive paste or a conductive tape.

The display panel PNL of the embodiment may be any one of a transmissive type having a transmissive display function of displaying images by allowing the light from a back surface side of the first substrate SUB1 to be selectively transmitted, a reflective type having a reflective display function of displaying images by allowing the light from a front surface side of the second substrate SUB2 to be reflected selectively, and a transreflective type having both the transmissive display function and the reflective display function.

Here, a detailed explanation of the configuration of the display panel PNL will be omitted, but the display panel PNL may be of any structure provided for a display mode using a lateral electric field along the main surface of the substrate, a display mode using a vertical electric field along a normal line of the main surface of the substrate, a display mode using an inclination electric field inclined in an oblique direction with respect to the main surface of the substrate, or even a display mode using the above-described lateral electric field, vertical electric field and inclination electric field in any appropriate combination. The main surface of the substrate here is a surface parallel to the X-Y plane defined by the first direction X and the second direction Y.

FIG. 2 is a sectional view of the display panel PNL taken along line C1-C2 shown in FIG. 1. Note that only the structure required for explanation is illustrated here.

As shown in FIG. 2, the second substrate SUB2 comprises an inner surface SA which opposes the first substrate SUB1, and an outer surface SB on an opposite side to the inner surface SA. A light-shielding layer LS is provided on the inner surface SA of the second substrate SUB2 so as to be located in the non-display area NDA. A boundary Bo between the display area DA and the non-display area NDA corresponds to an inner side end of the light shielding layer LS. A sealing member SE is placed on the non-display area NDA so as to adhere the first substrate SUB1 and the second substrate SUB2 to each other and to seal the liquid crystal layer LC. The sealing member SE is provided in a position overlapping the light shielding layer LS. The transparent conductive layer CL is provided on the outer surface SB, and over the display area DA and the non-display area NDA. Note that the transparent conductive layer CL may be provided on the outer surface of the insulating substrate contained in the second substrate SUB2, or on the outer surface of the optical element attached to the insulating substrate.

The connection member CN is in contact with the transparent conductive layer CL in the position overlapping the sealing member SE and the light shielding layer LS. Moreover, the connection member CN is formed on the first region A1 of the first substrate SUB1, so as to be in contact with the ground pad EP1 and the end portion E21 of the substrate. In the example illustrated, the ground pad EP1 is disposed over the first region A1 and the second region A2.

Figure 3:
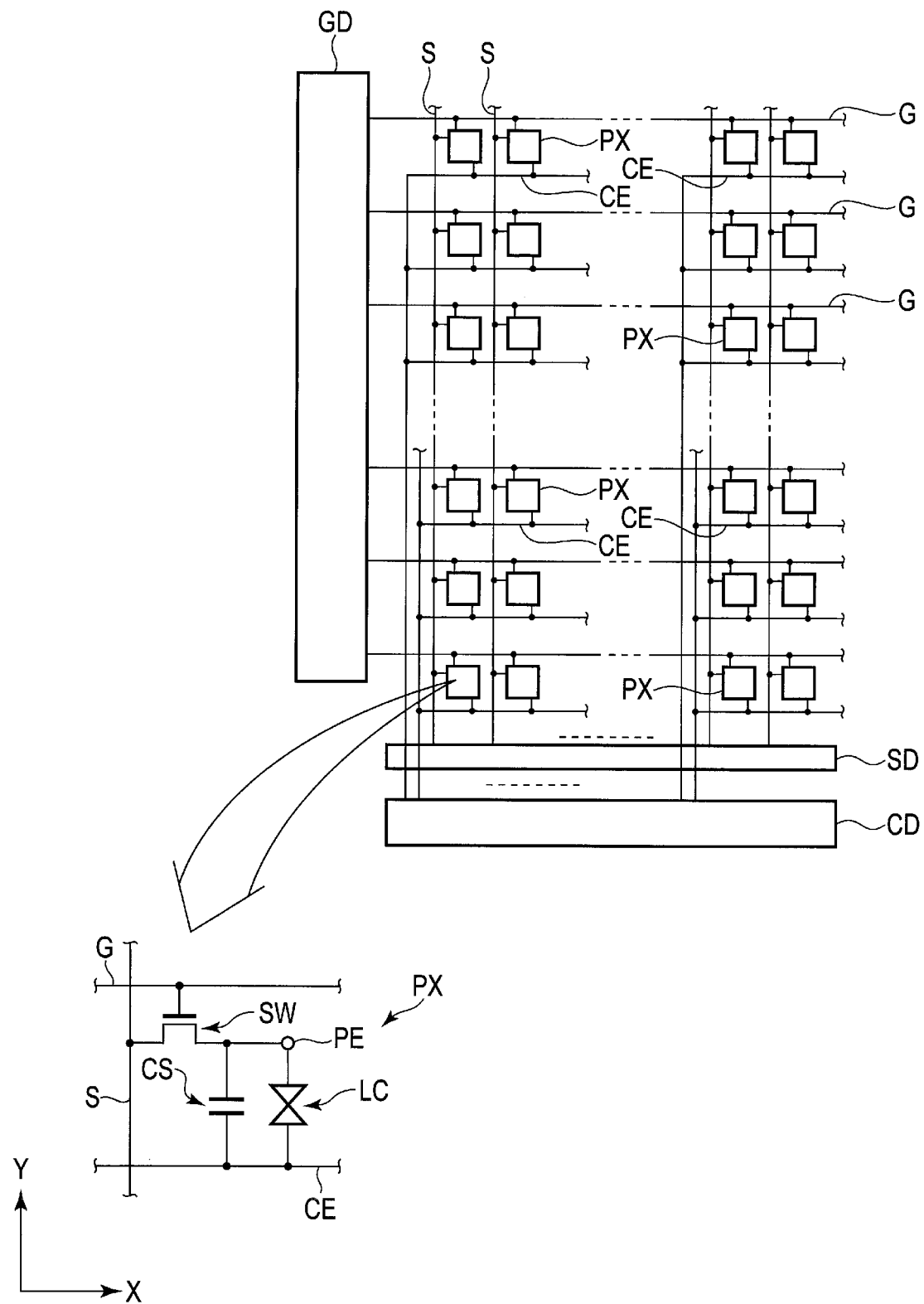
FIG. 3 is a diagram showing a basic configuration and an equivalent circuit of pixels.

FIG. 3 is a diagram showing the basic structure and the equivalent circuit of the pixels PX.

As shown in FIG. 3, a plurality of scanning lines G are connected to a scanning line drive circuit GD, and a plurality of signal lines S are connected to a signal line drive circuit SD. The scanning lines G and the signal lines S are each formed of a metal material such as aluminum (Al), titanium (Ti), silver (Ag), molybdenum (Mo), tungsten (W), copper (Cu) or chromium (Cr), or an alloy of any combination of these metal materials. The scanning lines G and the signal lines S may be formed of a single or multilayer structure. Note that the scanning lines G and the signal lines S do not necessarily have to extend linearly but may be partially bent. For example, even if a signal line S is partially bent, it is assumed that the line extends in the second direction Y.

Common electrodes CE are disposed across the pixels PX. The common electrodes CE is connected to a voltage supply portion CD and the touch controller TCN shown in FIG. 1. In the image display mode, the voltage supply portion CD supplies a common voltage (Vcom) to the common electrodes CE. In the touch sensing mode, the touch controller TON supplies a touch drive voltage different from the common voltage to the common electrode CE.

Each pixel PX comprises a switching element SW, a pixel electrode PE, the common electrode CE, a liquid crystal layer LC and the like. The switching element SW is formed from, for example, a thin film transistor (TFT) and is electrically connected to a respective scanning line G and a respective signal line S. The scanning line G is electrically connected to the switching element SW of each of the pixels PX arranged in the first direction X. The signal line S is electrically connected to the switching element SW of each of the pixels PX arranged in the second direction Y. To the scanning line G, the control signal to control the switching element SW is supplied. To the signal line S, a video signal, which is different from the control signal, is supplied. The pixel electrode PE is electrically connected to the switching element SW. The liquid crystal layer LC is driven by the electric field produced between the pixel electrode PE and the common electrode CE. A storage capacitor CS is formed, for example, between an electrode having the same potential as that of the common electrode CE and an electrode having the same potential as that of the pixel electrode PE.

FIG. 4 is a cross-sectional view showing a configuration example of the display panel PNL shown in FIG. 1. The example illustrated corresponds to an example employing a fringe field switching (FFS) mode, which is one of the display modes using a lateral electric field.

As shown in FIG. 4, the first substrate SUB1 comprises an insulating substrate 10, insulating layers 11 to 16, a semiconductor layer SC, signal lines S, metal wiring lines ML, the common electrode CE, the pixel electrodes PE, an alignment film AL1 and the like. The insulating substrate 10 is a transparent substrate such as a glass substrate or a flexible resin substrate. The insulating layer 11 is located on the insulating substrate 10. The semiconductor layer SC is located on the insulating layer 11, and is covered by the insulating layer 12. The semiconductor layer SC is formed of, for example, polycrystalline silicon but may be formed of amorphous silicon or an oxide semiconductor. The insulating layer 12 is covered by the insulating layer 13. The scanning lines G shown in FIG. 3 are located between the insulating layers 12 and 13. The signal lines S are located on the insulating layer 13, and are covered by the insulating layer 14. The metal wiring lines ML are located on the insulating layer 14, and are covered by the insulating layer 15. The metal wiring lines ML are formed of, for example, a metal material such as aluminum (Al), titanium (Ti), silver (Ag), molybdenum (Mo), tungsten (W), copper (Cu) or chromium (Cr), or an alloy of any combination of these metal materials. The metal wiring lines ML may be of a single or multilayer structure. The metal wiring lines ML extend parallel to the signal lines S and are located right above the respective signal lines S.

The common electrode CE is located on the insulating layer 15, and is covered by the insulating layer 16. The pixel electrodes PE are located on the insulating layer 16, and are covered by the alignment film AL1. The pixel electrodes PE each oppose the common electrode CE via the insulating layer 16. The common electrode CE and the pixel electrodes PE are each formed of a transparent conductive material such as ITO or IZO. The pixel electrodes PE are linear electrodes, and the common electrode CE is a plate-like electrode commonly provided over a plurality of pixels PX. Note that such a structure may as well be employed, that a plate-like electrode is used for each of the pixel electrode PE and a linear common electrode is provided between the pixel electrodes PE and the liquid crystal layer LC.

The insulating layer 11, the insulating layer 12, and the insulating layers 13 and 16 are inorganic insulating layers formed from an inorganic insulating material such as silicon oxide (SiO), silicon nitride (SiN) or silicon oxynitride (SiON). The insulating layer 16 is formed of, for example, silicon nitride. The insulating layer 11, the insulating layer 12 and the insulating layers 13 and 16 each may be of a single or multilayer structure. The insulating layers 14 and 15 are, for example, organic insulating layers formed from an organic insulating material such as acrylic resin.

The second substrate SUB2 comprises an insulating substrate 20, color filters CF, light-shielding layers BM, a transparent layer OC and an alignment film AL2. The insulating substrate 20 is a transparent substrate such as a glass substrate or a flexible resin substrate. The color filters CF, the light-shielding layers BM and the transparent layer OC are located between the insulating substrate 20 and the liquid crystal layer LC. The alignment film AL2 is in contact with the liquid crystal layer LC. The alignment films AL1 and AL2 are formed from, for example, a material which exhibits horizontal alignment property. The transparent layer OC covers the color filters CF and the light-shielding layers BM. The transparent layer OC is, for example, a transparent organic insulating layer. In the example illustrated, the color filters CF are provided in the second substrate SUB2, but they may be provided in the first substrate SUB1. The color filters CF include a red color filter CFR, a green color filter CFG and a blue color filter CFB. The green color filter CFG opposes respective pixel electrodes PE. The red color filter CFR and the blue color filter CFB also oppose other respective pixel electrodes PE, which are not illustrated.

The liquid crystal layer LC is located between the first substrate SUB1 and second substrate SUB2 and held between the first alignment film AL1 and the second alignment film AL2. The liquid crystal layer LC contains liquid crystal molecules LM. The liquid crystal layer LC is formed of a liquid crystal material of a positive type (positive dielectric anisotropy) or a negative type (negative dielectric anisotropy).

An optical element OD1 including a polarizer PL1 is adhered to the insulating substrate 10. The optical element OD2 including a polarizer PL2 is adhered to the insulating substrate 20. Note that the optical elements OD1 and OD2 may comprise a retardation film, a scattering layer, an antireflection layer or the like if needed. An illumination device IL illuminates the first substrate SUB1 of the display panel PNL with white illuminating light.

When the display panel PNL with such a structure is in an OFF state where an electric field is not formed between the pixel electrodes PE and the common electrode CE, the liquid crystal molecules LM are initially aligned in a predetermined direction between the alignment films AL1 and AL2. In an OFF state such as above, the illumination light applied towards the display panel PNL from the illumination device IL is absorbed by the optical elements OD1 and OD2, which makes dark display. On the other hand, in an ON state where an electric field is formed between the pixel electrodes PE and the common electrode CE, the liquid crystal molecules LM are aligned in a direction different from the initial alignment direction by the electric field and the alignment direction is controlled by the electric field. In an ON state such as above, part of the illumination light from the illumination device IL penetrates the optical elements OD1 and OD2, which makes bright display.

Figure 5:
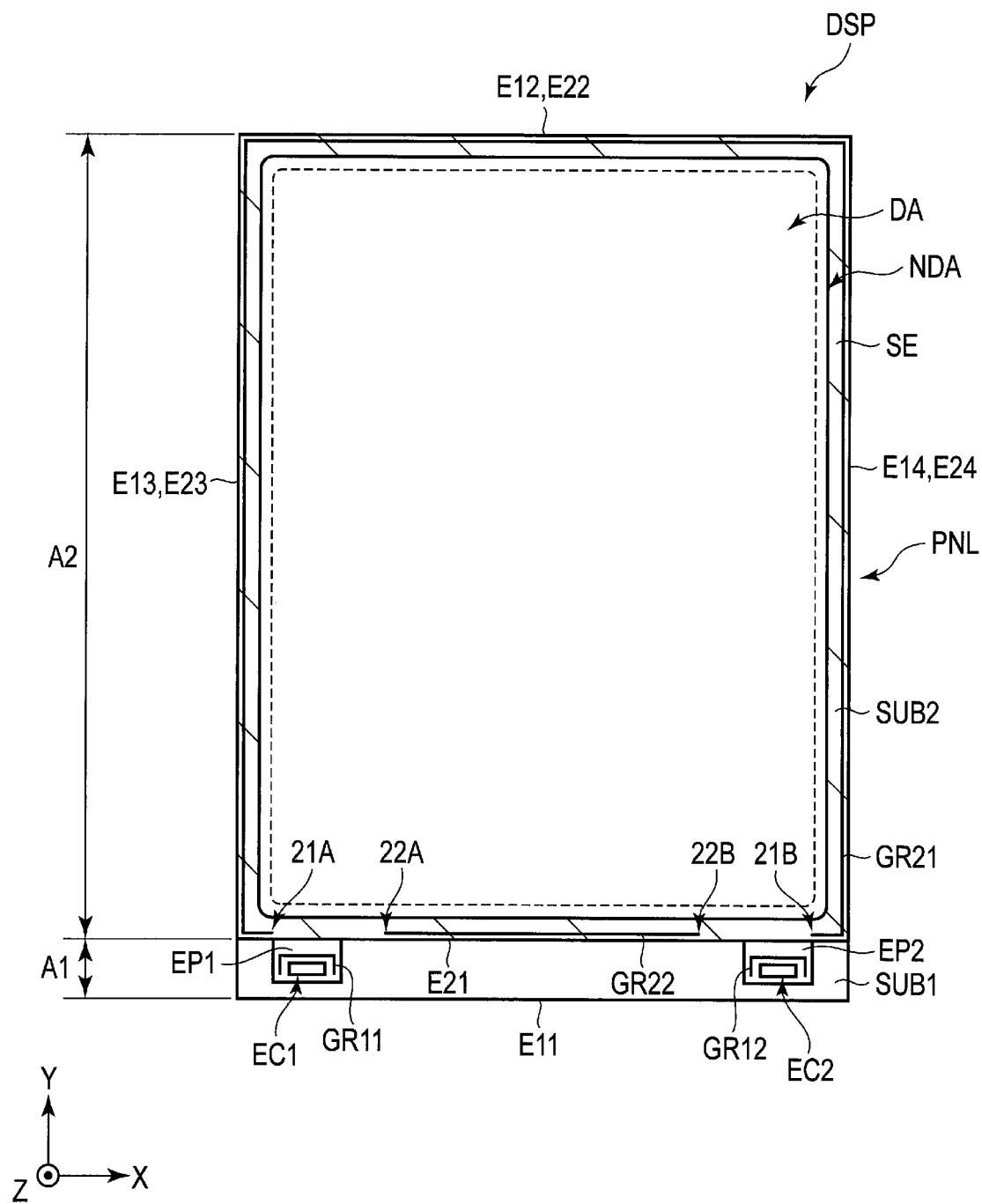
FIG. 5 is a plan view showing a plurality of groove portions of the display panel.

FIG. 5 is a plan view showing a plurality of groove portions GR of the display panel PNL. In FIG. 5, the sealing member SE is indicated by slash lines.

As shown in FIG. 5, the display panel PNL comprises a groove portion GR11, a groove portion GR12, a groove portion GR21 and a groove portion GR22. The groove portions GR11 and GR12 and the groove portions GR21 and GR22 are formed to penetrate the insulating layers 14 and 15 shown in FIG. 4.

The groove portions GR21 and GR22 are each located in the non-display area NDA of the second region A2, so as to overlap the sealing member SE. The groove portion GR21 and the groove portion GR22 are apart from each other. In plan view, the groove portion GR21 is formed to surround the display area DA. The groove portion GR21 extends in the first direction X between the end portion E21 and the display area DA, extends in the second direction Y between the end portion E23 and the display area DA, extends in the first direction X between the end portion E22 and the display area DA, and extends in the second direction Y between the end portion E24 and the display area DA. The groove portion GR22 extends in the first direction X between the end portion E21 and the display area DA. The groove portion GR21 includes an end portion 21A and an end portion 21B on an opposite side to the end portion 21A. The groove portion GR22 includes an end portion 22A and an end portion 22B on an opposite side to the end portion 22A. The end portion 21A and the end portion 22A oppose each other, and the end portion 21B and the end portion 22B oppose each other.

The ground pad EP1 is located between the end portion 21A and the end portion 22A in the first direction X. The ground pad EP2 is located between the end portion 22B and the end portion 21B in the first direction X. The ground pads EP1 and EP2 respectively include contact portions EC1 and EC2 each connected to ground potential.

The groove portions GR11 and GR12 are located in the first region A1. In plan view, the groove portion GR11 overlaps the ground pad EP1, and is located within the ground pad EP1. In plan view, groove portion GR12 overlaps the ground pad EP2, and is located within the ground pad EP2.

FIG. 6 is an expanded diagram showing the groove portion GR11 and the surrounding of the groove portion GR11 shown in FIG. 5.

As shown in FIG. 6, the first substrate SUE1 further comprises a metal layer 31, a plurality of metal layers 32, a transparent conductive layer 35 and wiring groups WG1 and WG2. The ground pad EP1 is formed of the metal layer 31, the metal layers 32, the transparent conductive layer 35 and the like.

The wiring groups WG1 and WG2 are located apart from each other. The wiring group WG1 extends in the first direction X between the end portion E21 and the groove portion GR11. The wiring groups WG1 and WG2 include a plurality of wiring lines formed from the same material as that of the signal lines S, and are connected to the IC chip 1, the wiring substrate F1 and the like, shown in FIG. 1. For example, the wiring group WG2 includes a plurality of signal lines S.

The metal layer 31 extends in the first direction X between the wiring group WG1 and the end portion E11, and overlaps the transparent conductive layer 35. The metal layer 31 is formed from the same material as that of the scanning lines G. The metal layers 32 each overlap the metal layer 31, and are arranged in the first direction X. The metal layers 32 are formed of the same material as that of the signal lines S. The insulating layer 16 shown in FIG. 4 is formed over the first region A1 and the second region A2. The insulating layer 16 comprises a plurality of opening portions OP1. Note that there may be only one opening portion OP1. The opening portions OP1 are each provided in a respective position where the metal layer 31 and a respective one of the metal layers 32 overlap each other. The transparent conductive layer 35 is electrically connected to the metal layer 31 and the metal layers 32 via the opening portions OP1. A contact portion EC1 of the ground pad EP corresponds to a region including all of the opening portions OP1. In plan view, the transparent conductive layer 35 extends from the opening portions OP1 to the second region A2, overlaps the wiring group WG1 and the end portion E21 of the substrate, and is formed across the boundary between the first region A1 and the second region A2.

The groove portion GR11 includes a first portion GP1, a second portion GP2, and a third portion GP3. The first portion GP1 extends along the opening portions O21 in the first direction X. The second portion GP2 and the third portion GP3 extends along the respective opening portions OP1 in the second direction Y. The second portion GP2 and the third portion GP3 are formed continuously with respect to the first portion GP1.

The opening portions OP1 are each located on an inner side of the first portion GP1 in the first direction X. The opening portion OP1 are located between the second portion GP2 and the third portion GP3 in the second direction Y.

Figure 7:
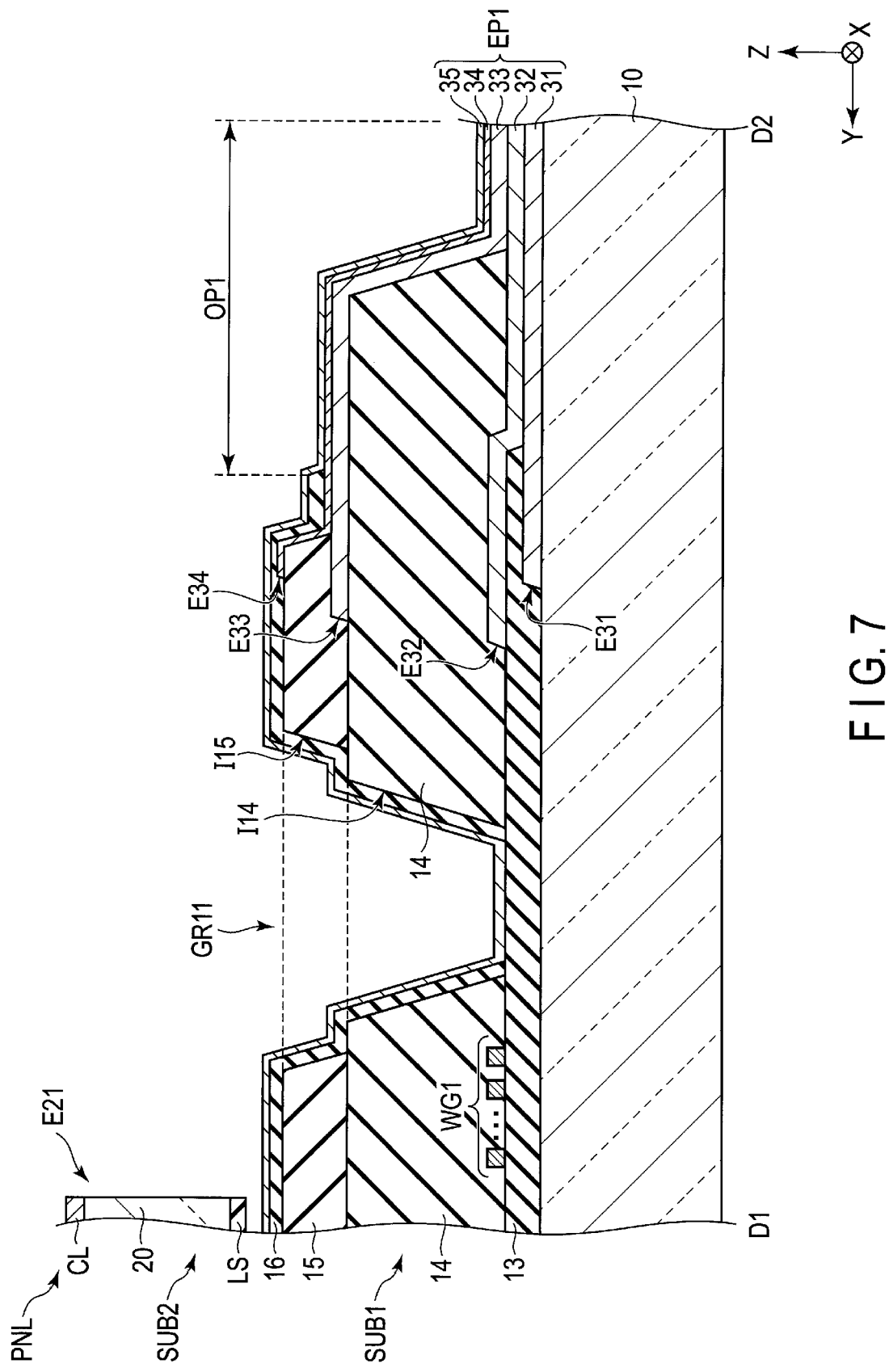
FIG. 7 is a cross sectional view of the display panel taken along line D1-D2 shown in FIG. 6.

FIG. 7 is a cross sectional view of the display panel PNL taken along line D1-D2 shown in FIG. 6.

As shown in FIG. 7, the first substrate SUB1 further comprises a metal layer 33 and a transparent conductive layer 34. The metal layer 31 is located above the insulating substrate 10. The metal layer 31 includes an end portion E31 covered by the insulating layer 13. The metal layer 32 is in contact with the metal layer 31. The metal layer 32 includes an end portion E32 located above the insulating layer 13. In the example illustrated, the end portion E32 is covered by the insulating layer 14 between the groove portion GR11 and the opening portion OP1. The metal layer 33 is in contact with the metal layer 32, and is located between the insulating layer 14 and the insulating layer 15. The metal layer 33 includes an end portion E33 located above the insulating layer 14. In the example illustrated, the end portion E33 is covered by the insulating layer 15 between the groove portion GR11 and the opening portion OP1.

The transparent conductive layer 34 is in contact with the metal layer 33. The transparent conductive layer 34 includes an end portion E34 located above the insulating layer 15. The end portion E34 is covered by the insulating layer 16. The transparent conductive layer 35 is in contact with the transparent conductive layer 34. The transparent conductive layer 35 overlaps the second substrate SUB2, and is in contact with the insulating layer 13 in a position where the insulating layer 13 is exposed from the insulating layer 16 in the groove portion GR11. In the example illustrated, the metal layer 31, a metal layer 32, a metal layer 33 and transparent conductive layers 34 and 35 are stacked one on another within the opening portion OP1. The metal layer 31, the metal layer 32, the metal layer 33 and the transparent conductive layers 34 and 35 are electrically connected to each other.

The wiring group WG1 is located above the insulating layer 13. The wiring group WG1 is formed in the same layer as the metal layer 32.

The insulating layer 14 exposes the insulating layer 13 in the groove portion GR11 located between the opening portion OP1 and the wiring group WG1. The insulating layer 14 comprises an inner surface 114 in the groove portion GR11. The insulating layer 14 covers the wiring group WG1 between the groove portion GR11 and the end portion E21. The insulating layer 15 exposes the insulating layer 14 in the groove portion GR11. The insulating layer 15 comprises an inner surface 115 in the groove portion GR11. The insulating layer 16 covers the inner surface 114 in the groove portion GR11 of the insulating layer 14, and is in contact with each of the inner surface 114 and the insulating layer 13. The insulating layer 16 covers the inner surface 115 in the groove portion GR11 of the insulating layer 15, and is in contact with the insulating layer 14. The insulating layer 16 exposes the insulating layer 13 in a position which overlaps the groove portion GR11.

In recent years, there is an increasing demand of narrowing the frame, and also a tendency of reducing the width of the non-display area NDA. For this reason, the interval between the display area DA and the end portion E21 is narrowed and the wiring density increases between the display area DA and the end portion E21; thus, there is a tendency that a groove portion which reduces moisture permeation to the display area DA, cannot easily formed in the organic insulating layer.

In this embodiment, the first substrate SUB1 comprises a groove portion GR11 between the wiring group WG1 and the opening portion OP1 in the first region A1. Even when moisture enters the organic insulating layers 14 and 15 from the opening portion OP1, it is possible to reduce the moisture having entered from spreading to the second region A2 side via the organic insulating layers 14 and 15. Thus, the possibility that the layer located between the organic insulating layer 15 and the inorganic insulating layer 16 detaching in the second region A2 by the moisture having entered can be reduced, the reliability of the display device DSP can be improved.

Further, in the groove portion GR11, the organic insulating layers 14 and 15 are each covered by the inorganic insulating layer 16. The inorganic insulating layer 16 is formed of silicon nitride which does not allow water to pass easily, and therefore it is possible to further inhibit the moisture having entered from the opening portion O21 from spreading to the second region A2 side.

In this embodiment, one or both of the transparent conductive layers 34 and 35 correspond to the first transparent conductive layer, the transparent conductive layer CL corresponds to the second transparent conductive layer, the insulating layer 13 corresponds to the first inorganic insulating layer, the insulating layer 16 corresponds to the second inorganic insulating layer, the insulating layer 14 corresponds to the first organic insulating layer, the insulating layer 15 corresponds to the second organic insulating layer, the metal layer 32 corresponds to the first metal layer, the metal layer 33 corresponds to the second metal layer, the inner surface 114 corresponds to the first inner surface, the inner surface 115 corresponds to the second inner surface, the end portion E32 corresponds to the first end portion, and the end portion E33 corresponds to the second end portion.

Figure 8:
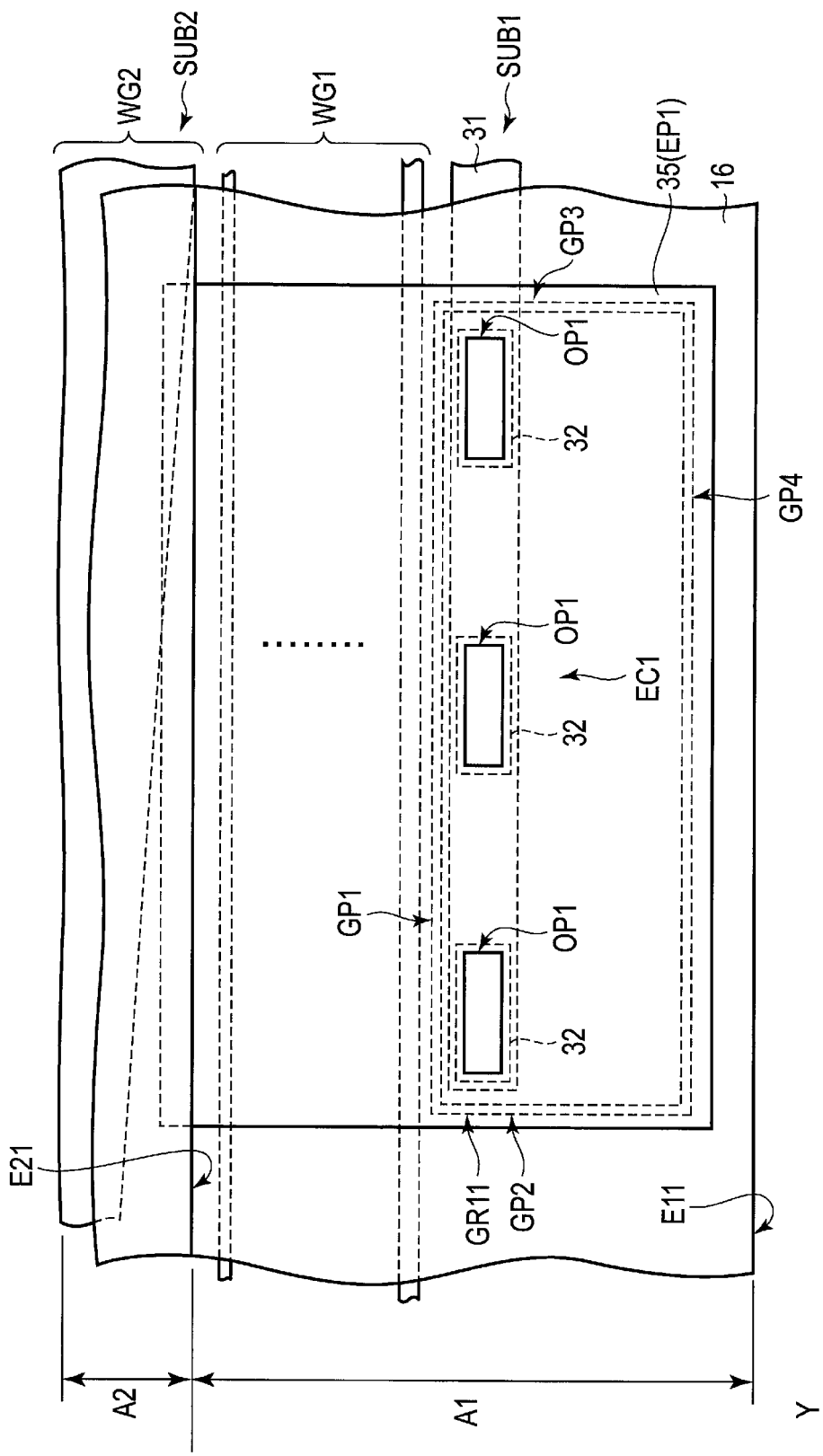
FIG. 8 is a plan view showing a modified example of this embodiment.

FIG. 8 is a plan view showing a modified example of this embodiment.

As shown in FIG. 8, the modified example is different from this embodiment in that the groove portion GR11 is formed into an annular shape which surrounds the contact portion EC1.

The groove portion GR11 includes a fourth portion GP4. The fourth portion GP4 is formed continuous to the second portion GP2 and the third portion GP3. In the example illustrated, the opening portions OP1 are surrounded by the first portion GP1, the second portion GP2, the third portion GP3 and the fourth portion GP4 in plan view.

Such a modified example as well can achieve an advantageous effect similar to that described embodiment. In addition, since the groove portion GR11 is annularly formed so as to surround all the opening portions OP1 (or the contact portion EC1), and thus it is possible to inhibit the moisture having entered from the opening portion OP1 from spreading to the outside of the groove portion GR11.

As described above, according to the present embodiment, a display device which improves the reliability can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
    a first substrate comprising a first region and a second region;
    a second substrate comprising a substrate end portion located in a boundary between the first region and the second region, and overlaps the second region; and
    a conductive connection member,
    the first substrate comprising, in the first region, a first inorganic insulating layer, a first metal layer, a wiring group located between the substrate end portion and the first metal layer and formed above the first inorganic insulating layer, a first organic insulating layer formed above the first inorganic insulating layer, the first metal layer and the wiring group, a second inorganic insulating layer formed above the first organic insulating layer and comprising an opening portion overlapping the first metal layer, and a first transparent conductive layer formed above the second inorganic insulating layer, overlapping the opening portion and electrically connected to the first metal layer, the second substrate comprising an inner surface opposing the first substrate, an outer surface opposite to the inner surface, and a second transparent conductive layer formed on the outer surface, the conductive connection member being in contact with the substrate end portion and connecting the first transparent conductive layer and the second transparent conductive layer to each other, the wiring group overlapping the first transparent conductive layer, and the first organic insulating layer comprising a groove portion which exposes the first inorganic insulating layer between the opening portion and the wiring group.

2. The display device of claim 1, wherein
the first organic insulating layer comprises a first inner surface in the groove portion, and
the second inorganic insulating layer covers the first inner surface and is in contact with the first inorganic insulating layer.

3. The display device of claim 2, wherein
the first metal layer comprises a first end portion provided above the first inorganic insulating layer, located between the groove portion and the opening portion, and covered by the first organic insulating layer.

4. The display device of claim 3, wherein
the first substrate further comprises, in the first region, a second organic insulating layer located between the first organic insulating layer and the second inorganic insulating layer, and a second metal layer located between the first organic insulating layer and the second organic insulating layer,
the groove portion is formed also in the second organic insulating layer,
the second organic insulating layer comprises a second inner surface in the groove portion, and
the second inorganic insulating layer covers the second inner surface and is in contact with the first organic insulating layer.

5. The display device of claim 4, wherein
the second metal layer comprises a second end portion provided above the first organic insulating layer, located between the groove portion and the opening portion, and covered by the second organic insulating layer.

6. The display device of claim 5, wherein
the groove portion comprises a first portion extending along the opening portion in the first direction, and
the opening portion is located on an inner side of the first portion in the first direction.

7. The display device of claim 6, wherein
the groove portion comprises a second portion and a third portion formed continuous to the first portion, and each extending along the opening portion in a second direction crossing the first direction, and
the opening portion is located on an inner side of the second portion and on an inner side of the third portion in the second direction.

8. The display device of claim 7, wherein
the groove portion comprises a fourth portion formed continuous to each of the second portion and the third portion, and
the opening portion is surrounded by the first portion, the second portion, the third portion and the fourth portion.

9. The display device of claim 8, wherein
the second inorganic insulating layer is formed of a silicon nitride.

10. The display device of claim 1, wherein
the groove portion comprises a first portion extending along the opening portion in the first direction, and
the opening portion is located on the inner side of the first portion in the first direction.

11. The display device of claim 1, wherein
the second inorganic insulating layer is formed of a silicon nitride.

12. A display device comprising:
a first substrate comprising a first region and a second region;
a second substrate comprising a substrate end portion located in a boundary between the first region and the second region and overlapping the second region, and
a conductive connection member,
the first substrate comprising, in the first region, a first inorganic insulating layer, a first metal layer, a wiring group located between the substrate end portion and the first metal layer and formed above the first inorganic insulating layer, a first organic insulating layer formed above the first inorganic insulating layer, the first metal layer and the wiring group, a second inorganic insulating layer formed above the first organic insulating layer and comprising an opening portion overlapping the first metal layer, and a first transparent conductive layer formed above the second inorganic insulating layer, overlapping the opening portion and electrically connected to the first metal layer, the second substrate comprising an inner surface opposing the first substrate, an outer surface opposite to the inner surface and a second transparent conductive layer formed in the outer surface, the conductive connection member being in contact with the substrate end portion and connecting the first transparent conductive layer and the second transparent conductive layer to each other, the first organic insulating layer comprising a groove portion which exposes the first inorganic insulating layer between the opening portion and the wiring group, and the first transparent conductive layer being in contact with the first inorganic insulating layer in the groove portion.

13. The display device of claim 12, wherein
the first transparent conductive layer overlapping the substrate end portion, formed across the boundary of the first region and the second region, and extending from the opening portion to the second region.

14. The display device of claim 13, wherein
the second inorganic insulating layer exposes the first inorganic insulating layer in a position which overlaps the groove portion, and
the first transparent conductive layer is in contact with the first inorganic insulating layer in a position where the first inorganic insulating layer is exposed from the second inorganic insulating layer in the groove portion.

15. The display device of claim 14, wherein
the first organic insulating layer comprises a first inner surface in the groove portion, and the second inorganic insulating layer is in contact with each of the first inner surface and the first inorganic insulating layer inside the groove portion.

* * * * *